United States Patent
Werner

(10) Patent No.: US 6,760,379 B1
(45) Date of Patent: Jul. 6, 2004

(54) CASCADING OF UP CONVERSION AND DOWN CONVERSION

(75) Inventor: Oliver Hartwig Werner, Laatzen (DE)

(73) Assignee: British Broadcasting Corporation, London (GB)

( * ) Notice: Subject to any disclaimer, the term of this patent is extended or adjusted under 35 U.S.C. 154(b) by 0 days.

(21) Appl. No.: 09/622,383

(22) PCT Filed: Mar. 8, 1999

(86) PCT No.: PCT/GB99/00682

§ 371 (c)(1),
(2), (4) Date: Nov. 20, 2000

(87) PCT Pub. No.: WO99/45645

PCT Pub. Date: Sep. 10, 1999

(30) Foreign Application Priority Data

Mar. 6, 1998 (GB) .............................. 9804936

(51) Int. Cl.[7] .................................. H04N 7/12
(52) U.S. Cl. .................... 375/240.21; 375/240.29; 348/392.1
(58) Field of Search .................. 375/240.21, 240.29, 375/371; 341/143; 348/392.1, 424.1, 427.1, 445, 454, 453, 458, 581, 614; 386/29

(56) References Cited

U.S. PATENT DOCUMENTS

| | | | |
|---|---|---|---|
| 5,086,488 A | | 2/1992 | Kato et al. |
| 5,103,228 A | * | 4/1992 | Voorman et al. ............ 341/143 |
| 5,142,380 A | | 8/1992 | Sakagami et al. |
| 5,214,676 A | * | 5/1993 | Wilkinson .................. 375/371 |
| 5,249,053 A | | 9/1993 | Jain |
| 5,438,625 A | | 8/1995 | Klippel |
| 5,500,739 A | * | 3/1996 | Strolle et al. ................. 386/29 |
| 5,512,956 A | | 4/1996 | Yan |
| 5,532,755 A | * | 7/1996 | Patel et al. .................. 348/614 |
| 5,576,837 A | * | 11/1996 | Strolle et al. ................. 386/33 |
| 5,629,779 A | | 5/1997 | Jeon |
| 5,642,115 A | | 6/1997 | Chen |
| 5,671,298 A | | 9/1997 | Markandey et al. |
| 5,748,245 A | | 5/1998 | Shimizu et al. |
| 5,802,218 A | | 9/1998 | Brailean |
| 5,831,688 A | | 11/1998 | Yamada et al. |
| 5,930,398 A | | 7/1999 | Watney |
| 5,991,456 A | | 11/1999 | Rahman et al. |
| 6,005,952 A | | 12/1999 | Klippel |
| 6,151,362 A | | 11/2000 | Wang |
| 6,163,573 A | | 12/2000 | Mihara |
| 6,249,549 B1 | * | 6/2001 | Kim ...................... 375/240.21 |
| 6,269,120 B1 | | 7/2001 | Boice et al. |
| 6,278,735 B1 | | 8/2001 | Mohsenian |
| 6,437,827 B1 | | 8/2002 | Baudouin |
| 6,539,120 B1 | | 3/2003 | Sita et al. |
| 6,570,922 B1 | | 5/2003 | Wang et al. |

* cited by examiner

*Primary Examiner*—Gims Philippe
(74) *Attorney, Agent, or Firm*—Michael Best & Friedrich LLP

(57) ABSTRACT

In digital video, 3:4 down conversion and 4:3 down conversion are transparently cascaded. The up conversion filter is: $S_{up}(n)=\Sigma S_{input}(k).g(3n-4k)$ and the down conversion filter is: $S_{down}(n)=\Sigma S_{up}(k).h(4n-3k)$. The pair of up and down conversion filters are designed so that $\Sigma h(4n-3k).g(3k-4m)$ is equal to unity if $n=m$ and is otherwise equal to zero.

5 Claims, 3 Drawing Sheets

(a) 3:4 UP CONVERSION (b) 4:3 DOWN CONVERSION

CASCADING OF UP CONVERSION AND DOWN CONVERSION

FIELD OF THE INVENTION

This invention relates to digital filtering of sampled signals and in an important example to filtering of digital video

BACKGROUND

The sampling rate of a digital video has to be changed for converting between different formats. For example, in order to save bandwidth a video signal may be stored and transmitted in a low resolution format but displayed in an up converted high resolution format. Typically, the sampling rate of the low resolution is related to the sampling rate of the high resolution by a ratio 1:M or by a ratio N:M where N and M are integers. Depending on the application, several cascades of up and down conversion filtering can occur. For example in a broadcast chain this is due to repeated editing, preview and storage operations. In order to achieve a perfect reconstruction of those parts of the pictures that have not been changed by editing operations up conversion from the low resolution to the high resolution and subsequent down conversion should result in a transparent cascade. Transparent cascading of N:M up and M:N down conversion filtering imposes additional problems on the filter design when compared with a cascade of up and down conversion filters for ratios 1:M and M:1.

SUMMARY

It is an object of one aspect of the present invention to provide an improved digital filtering process capable of transparent up conversion and cascaded down conversion.

Accordingly, the present invention consists in one aspect in a digital filtering process for achieving a transparent cascade on N:M up conversion and subsequent M:N down conversion, where the up and down conversion ratios N:M and M:N respectively are rational numbers and the integers N and M satisfy the condition 1<N<M, wherein the up conversion filter operates on a sampled signal $S_{input}$ and is chosen to take the form $s_{up}(n)=\Sigma s_{input}(k).g(Nn-Mk)$ and wherein a corresponding down conversion filter operates on the up converted signal $s_{up}$ and is chosen to take the form $s_{down}(n)=\Sigma s_{up}(k).h(Mn-Nk)$; the pair (g,h) of up and down conversion filters being chosen so that $\Sigma h(Mn-Nk).g(Nk-Mm)$ is equal to unity if n=m and, is otherwise equal to zero.

BRIEF DESCRIPTION OF THE DRAWINGS

The invention will now be described by way of example with reference to the accompanying drawings, in which.

DETAILED DESCRIPTION

Figure 1:
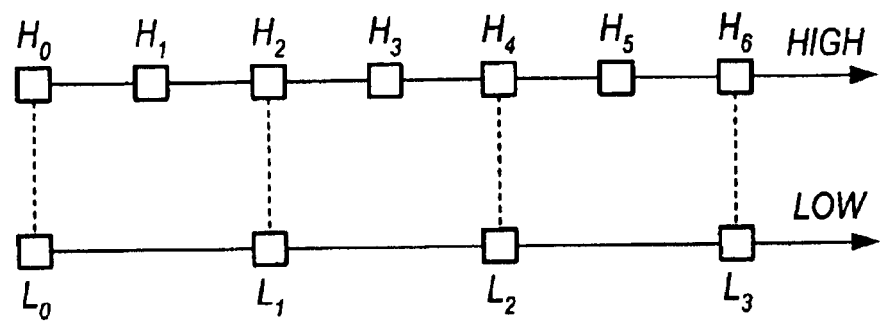
FIG. 1 is a diagram showing the low resolution and high resolution sampling grid for 1:2 up conversion and subsequent 2:1 down conversion.

For a ratio 1:M and isochronous sampling, the sampling grid of the low resolution signal forms a subset of the sampling grid of the high resolution signal as shown in FIG. 1 for the example ratio 1:2. Thus, if the samples of the low resolution signal are copied onto the corresponding positions of the high resolution grid on 1:M up conversion filtering, one subset that contains every M-th sample of the up converted signal coincides with the set of samples of the low resolution signal. An up conversion filter that has this property is called a I:M Nyquist filter. Therefore, if a 1:M Nyquist filter is followed by a M:1 down sampler one obtains mathematically the identity operator which makes the cascade transparent.

Figure 2:
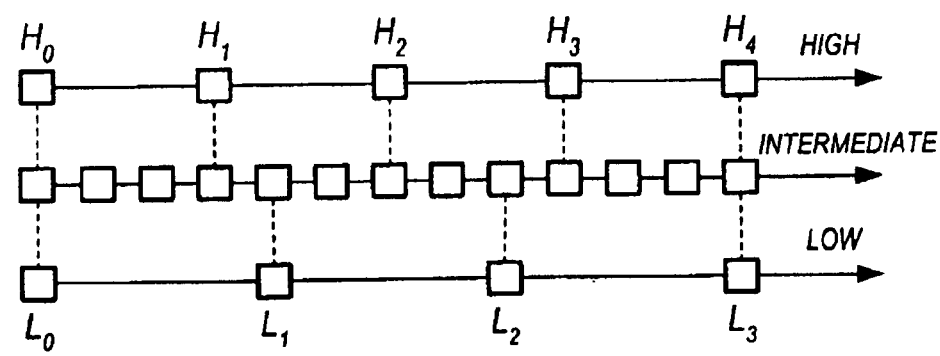
FIG. 2 is a diagram showing the low resolution and high resolution sampling grid for 3:4 up conversion and subsequent 4:3 down conversion, additionally, the sampling grid for the intermediate resolution.

However, this approach does not work for a ratio N:M such as 3:4. The reason is that the sampling grid of the low resolution signal is not an entire subset of the sampling grid of the high resolution signal. For example in the case of 3:4 up conversion only every third grid position of the low resolution signal coincides with a corresponding grid position of the high resolution signal as shown in FIG. 2. Thus, only one third of the samples can be copied from the low to the high resolution. Consequently, only one third of the samples of the low resolution signal can be recovered simply by sub-sampling the up converted signal. Additional filtering is needed on down conversion to recover the remaining two-thirds.

An example of a filtering process according to the present invention will now be described. This will for illustration concentrate on the example ratios 3:4 on up conversion and 4:3 on down conversion.

Figure 3:
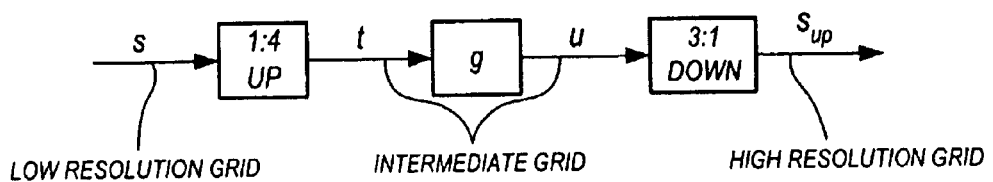
FIG. 3 is a block diagram illustrating the three stages of 3:4 up conversion, that is to say 1:4 up sampling, interpolation filtering, and 3:1 down sampling.

First, some principles of up and down conversion filtering are briefly reviewed. The sampling grids of the low and the high resolution are shown in FIG. 2 for 3:4 up conversion and subsequent 4:3 down conversion. Additionally, FIG. 2 shows the intermediate sampling grid on which all filter operations are performed. It is assumed throughout that all filter operations are linear and shift invariant. Thus, each filter can be described by its impulse response. Let g denote the impulse response of the 3:4 up conversion filter. The 3:4 up conversion process can be considered in three stages, see FIG. 3.

In the first stage the low resolution signal s is up sampled by the factor 1:4 resulting in the signal t which is defined on the intermediate sampling grid as follows, $$t(n) = \begin{cases} s(k) & \text{if } n = 4k \\ 0 & \text{otherwise} \end{cases} \quad (1)$$

In the second stage the signal t is interpolated into the signal u, $$u(n) = \sum_k t(k) \cdot g(n-k) \quad (2)$$

In the third stage the interpolated signal u is down sampled by the factor 3:1, resulting in the up converted signal $$s_{up}(n) = u(3n) \quad (3)$$

Equations (1) to (3) define the functional relationship between the low resolution signal s and the up converted signal $s_{up}$, $$s_{up}(n) = \sum_k s(k) \cdot g(3n-4k) \quad (4)$$

As every third position of the low resolution sampling grid coincides with a position of the high resolution sampling grid, the samples of these positions can be copied on 3:4 up conversion, $$s_{up}(4n) = s(3n) \quad (5)$$

One can derive equation (5) from equation (4) if the filter g fulfils the Nyquist condition for 1:4 up conversion, $$g(4n) = \begin{cases} 1 & \text{if } n = 0 \\ 0 & \text{otherwise} \end{cases} \quad (6)$$

In this description a 3:4 up conversion filter g that fulfils equation (6) is called a 3:4 Nyquist filter. Correspondingly, equation (5) is called the 3:4 Nyquist condition.

Figure 4:
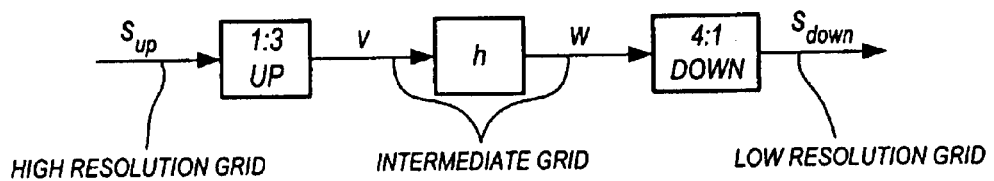
FIG. 4 is a block diagram illustrating the three stages of 4:3 down conversion, i.e. that is to say 1:3 up sampling, interpolation filtering, 4:1 down sampling.

Similar to 3:4 up conversion, the 4:3 down conversion process can be considered in three stages, see FIG. 4. The relationship between the up converted signal $s_{up}$, and the down converted signal $s_{down}$ becomes $$s_{down}(n) = \sum_k s_{up}(k) \cdot h(4n - 3k) \quad (7)$$

where h denotes the impulse response of the 4:3 down conversion filter.

Similar to equation (5), the Nyquist condition for 4:3 down conversion can be specified, $$s_{down}(3n) = s_{up}(4n) \quad (8)$$

One can derive equation (8) from equation (7) if the filter h fulfils the Nyquist condition for 1:3 up conversion, $$h(3n) = \begin{cases} 1 & \text{if } n = 0 \\ 0 & \text{otherwise} \end{cases} \quad (9)$$

In this description a 4:3 down conversion filter h that fulfils equation (9) is called a 4:3 Nyquist filter.

One concludes from equations (5) and (8) that the cascade of a 3:4 Nyquist filter which is followed by a 4:3 Nyquist filter gives a perfect reconstruction for every third sample of the low resolution signal, i.e.

$$s_{down}(3n) = s(3n) \quad (10)$$

However, in order to recover the remaining two-thirds, resulting in $$s_{down}(n) = s(n) \quad (11)$$

the pair (g, h) of up and down conversion filters has to fulfil the condition:

$$\sum_k h(4n - 3k) \cdot g(3k - 4m) = \begin{cases} 1 & \text{if } n = m \\ 0 & \text{otherwise} \end{cases} \quad (12)$$

Equation (12) is the condition for transparent cascading that can be derived straightforwardly from equations (4) and (7). It shows that the filter coefficients of g and h cannot be chosen independently. For given coefficients of g equation (12) becomes a linear equation system for the coefficients of h and vice versa.

From equation (12) one can derive the corollary, that if equation (12) is fulfilled by the pair of up and down conversion filters (g,h) and, additionally, the impulse response of g is symmetric, i.e. $g(n)=g(-n)$ then:

i) equation (12) is also fulfilled by the pair of filters (g, h__) with $h\_(n)=h(-n)$
ii) equation (12) is also fulfilled by the pair of filters (g, h~) with h~=(1−λ).h+λ.h__ and −∞≤λ≤∞, in particular the impulse response of h~=(h+h__)/2 is symmetric.

The up converted signal $s_{up}$ should give a good picture quality on displaying. Therefore, firstly the coefficients of the up conversion filter g can be chosen to fulfil this requirement and then a corresponding down conversion filter h can be designed to comply with equation (12), resulting in a transparent cascade.

Figure 5:
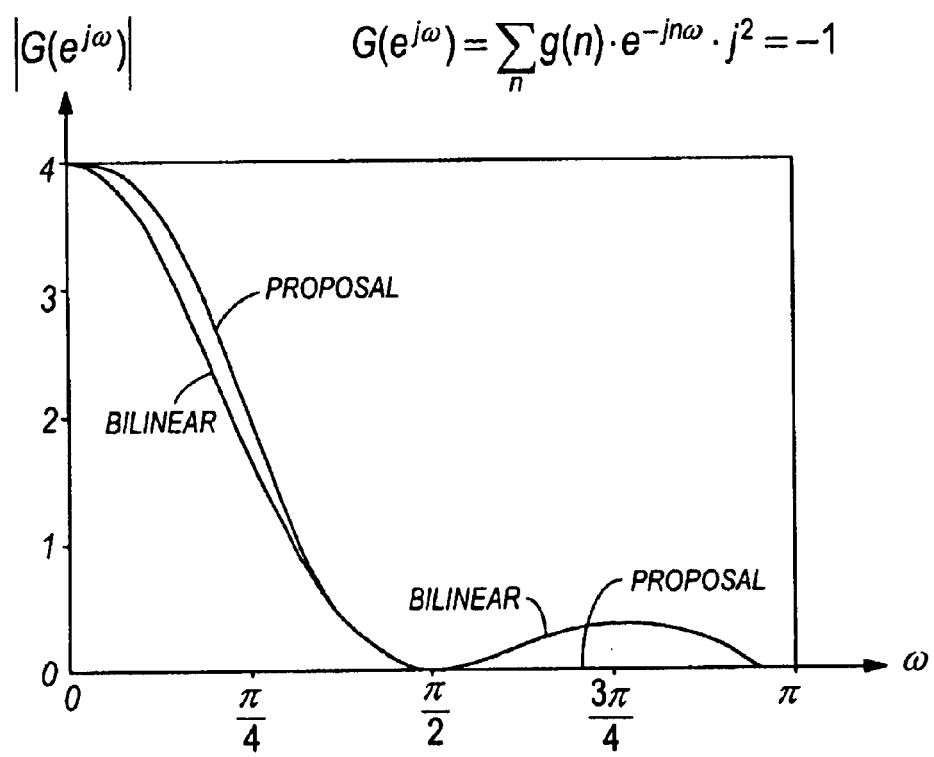
FIG. 5 is a graph showing the frequency response of 3:4 up conversion filter, bilinear and proposed filter.

The length of the impulse response is an obvious limitation in practical applications. Bilinear interpolation results in a short impulse response. The coefficients of the symmetric impulse response $g_{bil}$ are shown in Table 1. However, bilinear interpolation filtering does not result in a sophisticated low pass characteristic. Therefore, Table 1 shows also the symmetric impulse response of the filter $g_{def}$ that is proposed for 3:4 up conversion. The filter coefficients are derived from a windowed sin(x)/x waveform to give a better low pass characteristic than the bilinear interpolation filter. The frequency responses of $g_{bil}$ and $g_{def}$ are compared in FIG. 5. The improved low pass characteristic comes at a price as 15 taps are needed for $g_{def}$ but only 7 taps for $g_{bil}$. The coefficients of $g_{def}$ are rounded to six decimal digits as shown in Table 1. It is not difficult to verify that both up conversion filters of Table 1 are 3:4 Nyquist filters.

For the given 3:4 Nyquist filters $g_{bil}$ and $g_{def}$ corresponding 4:3 Nyquist filters $h_{undo-bil}$ and $h_{undo-def}$ respectively, are designed in order to comply with equation (12). The filter coefficients are also listed in Table 1. Similar to $g_{def}$ the coefficients of $h_{undo-def}$ are rounded to six decimal digits. In contrast to the up conversion filters, the corresponding down conversion filters of Table 1 do not have a symmetric impulse response. Again, the impulse response length of the proposed filter is larger, i.e. 29 taps are needed for $h_{undo-def}$ but only 9 taps for $h_{undo-bil}$.

It follows from the corollary to equation (12) that the non-symmetric impulse responses of the down conversion filters of Table 1 can be converted into symmetric impulse responses by mirroring. However, this would increase the number of filter taps.

It will be understood that this invention has been described by way of example only and that a wide variety of modifications are possible without departing from the scope of the invention.

It has already been explained that the ratios 3:4 and 4:3 have been chosen by way of illustration only. The invention is more broadly applicable to cascaded N:M up conversion and subsequent M:N down conversion, where the up and down conversion ratios N:M and M:N respectively are rational numbers and the integers N and M satisfy the condition 1<N<M. In the field of video, the invention is applicable not only to horizontal processing, but also to vertical processing and temporal processing. If processing is required in two or more of these dimensions, it will generally be possible to identify pairs of one dimensional filters in accordance with the present invention and then to cascade those filters to achieve the desired two or three dimensional processing.

TABLE 1

Nyquist filter for 3:4 up conversion, bilinear (bil) and proposed filter (def) and Nyquist filter for subsequent 4:3 down conversion, undo bilinear (undo-bil), undo proposed (undo-def) 3:4 up conversion

| n | $g_{bil}(n)$ | n | $h_{undo-bil}(n)$ | n | $g_{def}(n)$ | n | $h_{undo-def}(n)$ |
|---|---|---|---|---|---|---|---|
| 0 | 1 | −8 | 1/3 | 0 | 1 | −8 | 0.003449 |
| −1, 1 | 3/4 | −7 | 0 | −1, 1 | 0.854892 | −7 | 0 |
| −2, 2 | 1/2 | −6 | 0 | −2, 2 | 0.530332 | −6 | 0 |
| −3, 3 | 1/4 | −5 | −4/3 | −3, 3 | 0.204804 | −5 | 0 |
| otherwise | 0 | −4 | −1/3 | −4, 4 | 0 | −4 | 0.053745 |
| | | −3 | 0 | −5, 5 | −0.054860 | −3 | 0 |
| | | −2 | 2 | −6, 6 | −0.030332 | −2 | 0.113710 |
| | | −1 | 4/3 | −7, 7 | −0.004832 | −1 | 0 |
| | | 0 | 1 | otherwise | 0 | 0 | 1 |
| | | otherwise | 0 | | | 1 | 1.099232 |
| | | | | | | 2 | 1.771901 |
| | | | | | | 3 | 0 |
| | | | | | | 4 | −0.222855 |
| | | | | | | 5 | −1.099232 |
| | | | | | | 6 | 0 |
| | | | | | | 7 | 0.005838 |
| | | | | | | 8 | 0.280050 |
| | | | | | | 9 | 0 |
| | | | | | | 10 | 0.000604 |
| | | | | | | 11 | −0.005838 |
| | | | | | | 12 | 0 |
| | | | | | | 13 | 0 |
| | | | | | | 14 | −0.000604 |
| | | | | | | 15 | 0 |
| | | | | | | 16 | 0.000018 |
| | | | | | | 17 | 0 |
| | | | | | | 18 | 0 |
| | | | | | | 19 | 0 |
| | | | | | | 20 | −0.000018 |
| | | | | | | otherwise | 0 |

What is claimed is:

1. A filtering process for achieving a transparent cascade on up conversion in the sampling rate ratio N:M where N and M are integers and subsequent M:N down conversion, where the up and down conversion ratios N:M and M:N respectively are rational numbers and the integers N and M satisfy the condition 1<N<M, wherein the up conversion filter operates on a sampled signal $S_{input}$ and is chosen to take the form $S_{up}(n)=\Sigma S_{input}(k).g(Nn-Mk)$ where k is the running integer over which the sum is taken and wherein a corresponding down conversion filter operates on the up converted signal Sup and is chosen to take the form $S_{down}(n)=\Sigma S_{up}(k).h(Mn-Nk)$; the pair (g, h) of up and down conversion filters being chosen so that $\Sigma h(Mn-Nk).g(Nk-Mm)$ is equal to unity if n=m and is otherwise equal to zero.

2. A process according to claim 1, wherein the up conversion filter is a N:M Nyquist filter with a symmetric impulse response and the down conversion filter is a M:N Nyquist filter with a non-symmetric impulse response.

3. A process according to claim 1, wherein the up conversion filter is a N:M Nyquist filter with a symmetric impulse response and the down conversion filter is a M:N Nyquist filter with a symmetric impulse response.

4. A pair of respectively N:M up conversion and subsequent M:N down conversion filters, where the up and down conversion ratios N:M and M:N respectively are rational numbers and the integers N and M satisfy the condition 1<N<M, wherein the up conversion filter is adapted to operate on a sampled signal $s_{input}$ and is chosen to take the form of $s_{up}(n)=\Sigma s_{input}(k).g(Nn-Mk)$ and wherein the down conversion filter is adapted to operate on the up converted signal $s_{up}$ and is chosen to take the form of $s_{down}(n)=\Sigma s_{up}(k).h(Mn-Nk)$; the pair (g,h) of up and down conversion filters being chosen so that $\Sigma h(Mn-Nk).g(Nk-Mm)$ is equal to unity if n=m and is otherwise equal to zero.

5. A M:N down conversion filter adapted to operate on the output $s_{up}(n)$ of a N:M up conversion digital filter of the form $S_{up}(n)=\Sigma s_{input}(k). g(Nk-Mn)$, where the up and down conversion ratios N:M and M:N respectively are rational numbers and the integers N and M satisfy the condition 1<N<M, wherein the down conversion filter is chosen to take the form $s_{down}(n)=\Sigma s_{up}(k).h(Mn-Nk)$; where $\Sigma h(Mn-Nk).g(Nk-Mm)$ is equal to unity if n=m and is otherwise equal to zero.

* * * * *